(12) United States Patent
Schwartz

(10) Patent No.: US 8,618,411 B2
(45) Date of Patent: Dec. 31, 2013

(54) METHOD OF MAKING PHOTOVOLTAIC CELL

(76) Inventor: David M. Schwartz, Fair Oaks, CA (US)

( * ) Notice: Subject to any disclaimer, the term of this patent is extended or adjusted under 35 U.S.C. 154(b) by 1302 days.

(21) Appl. No.: 12/420,350

(22) Filed: Apr. 8, 2009

(65) Prior Publication Data

US 2010/0261306 A1    Oct. 14, 2010

(51) Int. Cl.
*H01L 31/18* (2006.01)
*H01L 31/103* (2006.01)
*H01L 31/0296* (2006.01)

(52) U.S. Cl.
USPC ............. 136/260; 136/264; 136/252; 438/89; 438/94; 438/95; 438/98; 438/603; 257/E31.004

(58) Field of Classification Search
USPC .......... 136/260, 264, 252; 438/89, 94, 95, 98, 438/603; 257/E31.004
See application file for complete search history.

(56) References Cited

U.S. PATENT DOCUMENTS

| 4,069,356 | A | * | 1/1978 | Fischer | 438/95 |
| 4,207,119 | A | * | 6/1980 | Tyan | 136/258 |
| 4,650,921 | A | * | 3/1987 | Mitchell | 136/258 |
| 4,709,466 | A | | 12/1987 | McCandless et al. | |
| 5,248,349 | A | | 9/1993 | Foote et al. | |
| 5,275,714 | A | | 1/1994 | Bonnet et al. | |
| 5,304,499 | A | | 4/1994 | Bonnet et al. | |
| 5,393,675 | A | * | 2/1995 | Compaan | 438/95 |
| 5,536,333 | A | | 7/1996 | Foote et al. | |
| 5,712,187 | A | | 1/1998 | Li et al. | |
| 6,251,701 | B1 | * | 6/2001 | McCandless | 438/95 |
| 2007/0093059 | A1 | | 4/2007 | Basol | |
| 2008/0216892 | A1 | | 9/2008 | Alivisatos et al. | |

* cited by examiner

*Primary Examiner* — Golam Mowla
(74) *Attorney, Agent, or Firm* — Shoemaker and Mattare

(57) ABSTRACT

A photovoltaic cell is made by coating a metal foil substrate with cadmium telluride powder, moving the powder coated foil across a cold plate or series of cooled rollers to prevent the substrate from melting, while melting the cadmium telluride powder by passing the powder coated foil under a microwave energy source. This forms a thin film of cadmium telluride on the foil. The cadmium telluride coated foil is then coated with cadmium sulfide powder, which is melted by passing the powder coated foil under a microwave energy source, thereby creating a P-N junction, and the cadmium sulfide layer is coated with indium, which is fused to the cadmium sulfide layer by microwave heating.

5 Claims, 3 Drawing Sheets

METHOD OF MAKING PHOTOVOLTAIC CELL

BACKGROUND OF THE INVENTION

This invention relates to a method of making cadmium-based photovoltaic cells.

Previous processes for manufacturing this type of cell all suffer from high costs due to time consuming methods of production. Those methods are substantially the same as the methods used by the semiconductor industry and are restricted to batch production of discrete panels.

Vapor deposition or sublimation in a vacuum chamber is used to form the solar conversion layers of the cells. Both vapor deposition and sublimation are inherently slower than the method described below. In the existing methodology, of fabricating cadmium based PV solar cells, each layer is applied to a glass panel. At the end of the stacked thin film fabrication process, the indium conduction layer must be exposed by mechanical processing, since it was buried by succeeding layers of material.

Microwave heating has been used to melt materials within many industrial processes. I am not aware of its commercial use to form thin (100 nanometer or less) films on glass sheets or metal foils. One Japanese university research paper disclosed that microwave heating was used to melt cadmium telluride onto a copper plate.

Liquid nitrogen cooling is used commercially for many purposes, especially in biomedical and pharmaceutical production.

Using ultra-cooling simultaneously with high-temperature heating to control the development of the P-N junction between two semiconductors is not disclosed in the prior art nor is it found in commercial processes. Attempting to form a stacked thin-film PV cell with heat alone results in excessive mixing of the layers and little if any voltage potential between the layers.

SUMMARY OF THE INVENTION

An object of the invention is to simplify the manufacture of cadmium-based photovoltaic cells.

These and other objects are attained by a method of making photovoltaic cells, as described below.

BRIEF DESCRIPTION OF THE DRAWINGS

In the accompanying drawings.

DESCRIPTION OF THE PREFERRED EMBODIMENT

Figure 1:
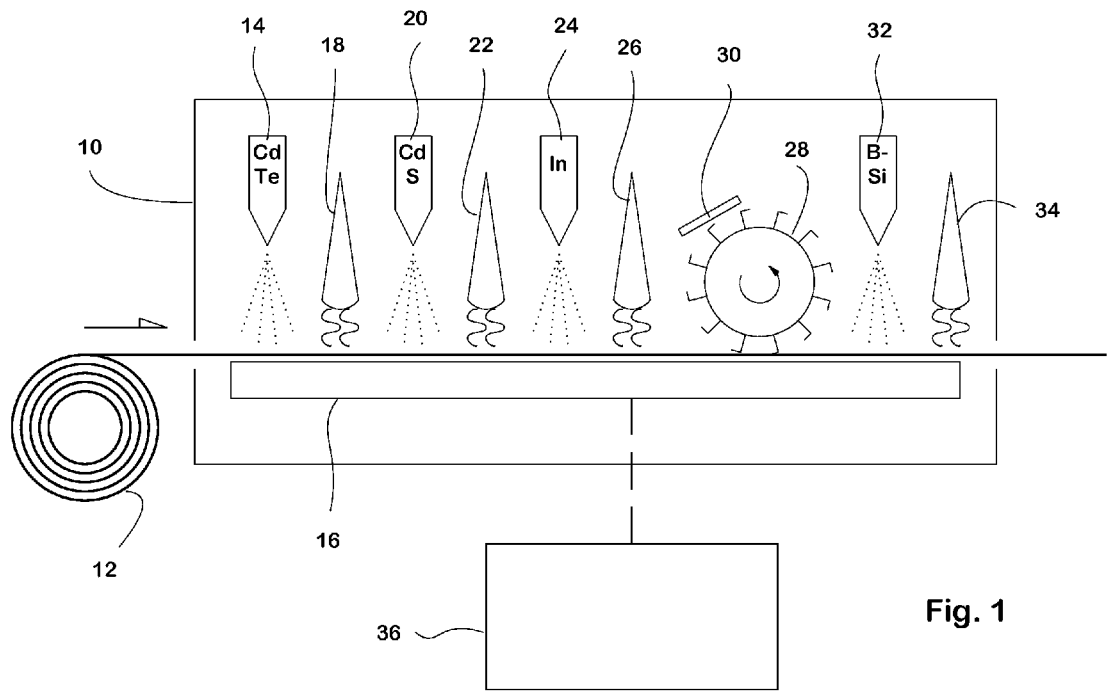
FIG. 1 is a schematic diagram of an apparatus for carrying out the invention.

The method of this invention is carried out in a chamber 10 (FIG. 1) at ambient pressure, or slightly higher, in an atmosphere of filtered air or inert gas. A metal foil 12 such as nickel, fed from a roll of material, is first powder coated with cadmium telluride 14. The powder coated foil is drawn across a cold plate 16 (FIG. 1)—or alternatively series of cooled rollers (FIG. 2)—and beneath a first microwave source 18, which may have a magnetron tube similar to the 1200 Watt magnetron tube in a consumer oven. The microwave energy is absorbed by the CdTe powder coating, melting it onto the foil and forming a thin film 50 to 100 nanometers thick. The coating thickness is maintained by controlling the powder coating rate and foil speed.

The simultaneous heating and cooling of the target assembly requires that the amount of thermal energy supplied as heat must be balanced by the amount of thermal energy removed by cooling. For example, if the total heating energy supplied to the target assembly in the processing tunnel is 100,000 BTUs per hour, the amount of heat removed by the cooling systems must also be nearly 100,000 BTUs per hour. A very small difference, less than a one tenth of one percent, between input energy and removed energy is the quantity consumed by the partial crystallization of the cadmium in the target assembly.

The thin film and metal assembly is next powder coated with cadmium sulfide 20 and is drawn under a second microwave source 22, which melts the cadmium sulfide onto the cadmium telluride film, creating the P-N junction between the two materials.

The three-layer assembly of nickel, cadmium telluride and cadmium sulfide is further coated with indium 24, which is fused to the cadmium sulfide film by microwave heating with a third microwave source 26.

The indium coated assembly is then passed under a sheepsfoot type of roller 28, which deposits a resist material 30 to the indium layer in a regular pattern of spots. These spots of resist material will prevent the next layer of powder coating from forming a bond to the indium substrate.

The assembly is then coated with borosilicate powder 32, which is then melted by microwave energy from a fourth source 34 to form the sun-facing surface of the solar cell. The borosilicate glass film does not adhere to the indium layer in the spots where the resist was applied.

During the entire process outline above, the temperature of each substrate is maintained low enough so that the substrate remains substantially solid. Thus, only a small fraction, less than 5% of the thickness of the substrate film is melted by application of the succeeding layer. Substrate cooling is achieved by the heat sink effect of the cold plate 16 (FIG. 1) or cooled rollers 16' (FIG. 2).

Figure 3:
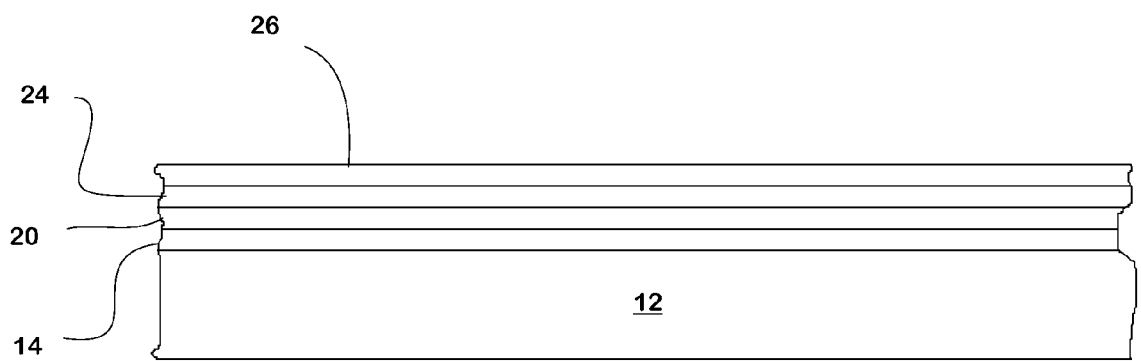
FIG. 3 is a cross-sectional view of a product produced by the invention.
Figure 4:
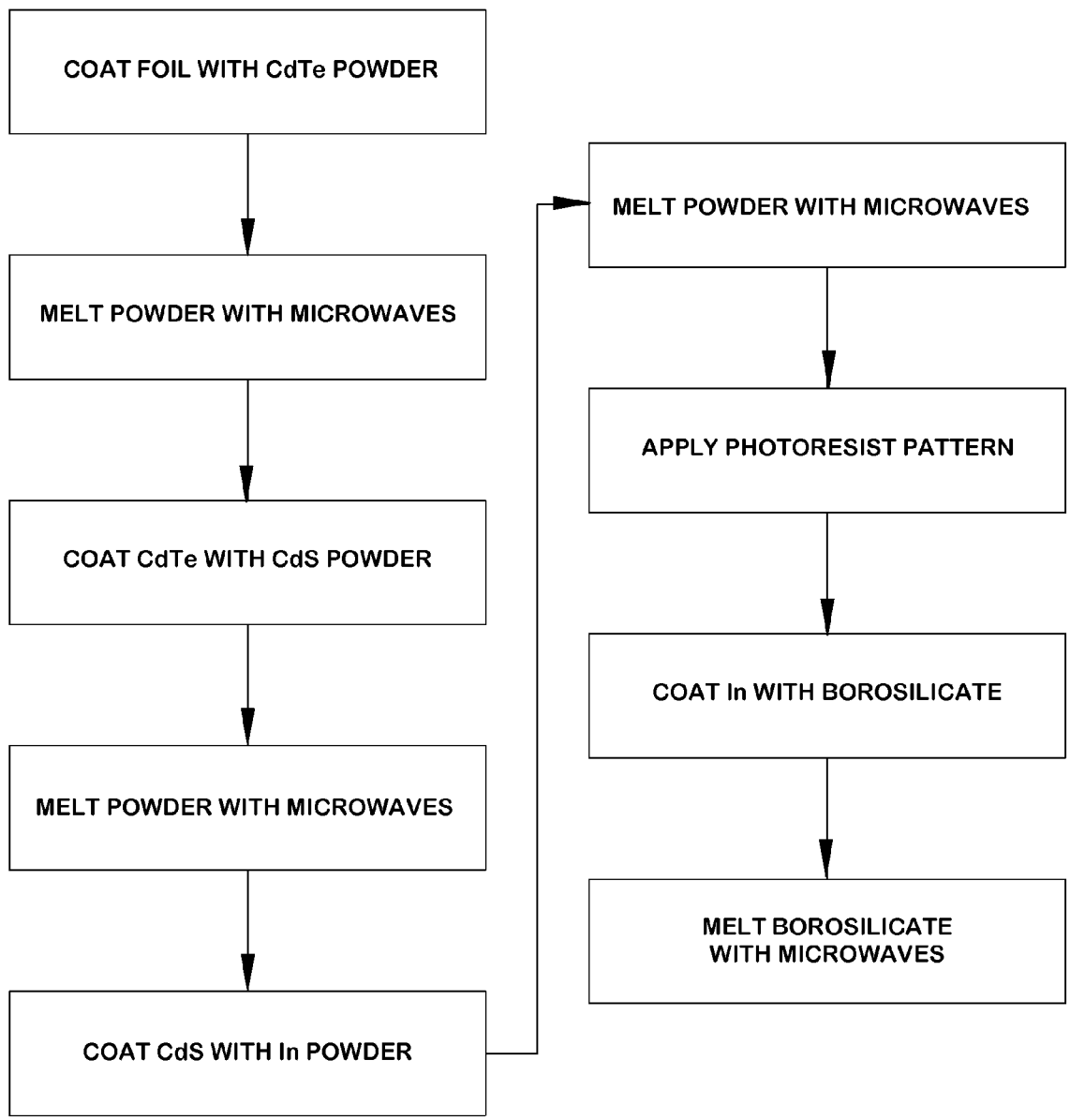
FIG. 4 is a flow chart illustrating the method of making photovoltaic cell embodying the invention.

The completed sandwich of materials (FIG. 3) is then cut into panels as it exits the coating chamber. The panels are further processed by abrasive cleaning and suction to remove the glass at the resist spots. Pickup wires are attached at those locations. Pickup wires are also attached to the nickel back surface of the panels.

Figure 2:
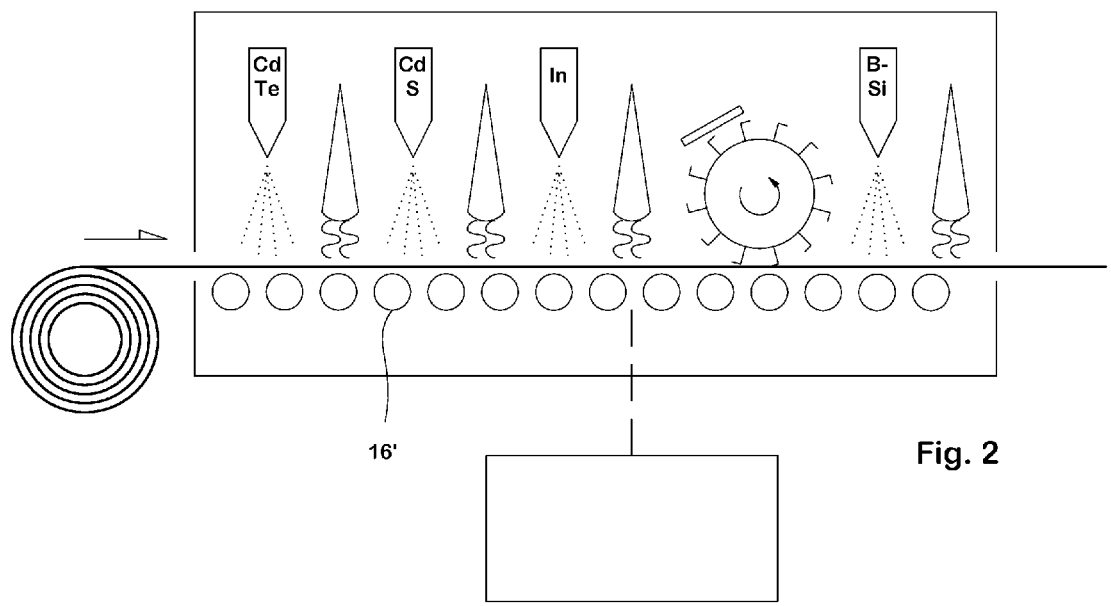
FIG. 2 is a diagram of an alternative form of the apparatus.

As shown in FIG. 1, a preferred process chamber is a tunnel configuration, with each stage of the process arrayed along its length. Generally, the inside top area of the tunnel is where the coaters and heat sources are located. Generally, the inside lower area of the tunnel is where the cooling elements are located.

Roll-fed materials can be fed into the tunnel from the starting end or alternatively, cut sheets of material can be fed from a stack loader. A series of rollers and plates support the material as it passes through the tunnel. The rollers and/or plates are cooled by a liquid such as nitrogen passing through them.

The cadmium, indium and borosilicate glass materials can be applied to their respective substrates as a dry powder or suspended within a liquid ("paint"). When the initial substrate is glass and not a metal foil, the last layer of the cell to be fabricated is a metal, which may be applied as a powder, paste, or paint.

While the preferred energy source for melting the powders or paints into a solid film is a microwave source including a magnetron tube, another source that allows for uniform heating may also be utilized.

To avoid excessive contamination by reactive atmospheric gases such as oxygen, the process chamber can be positively pressurized with an inert gas such as helium.

Cooling the cadmium telluride over a nickel foil substrate can advantageously cause the cadmium material to microcrack, forming numerous cavities across its entire surface. The cracks increase the efficiency of the finished cell by allowing more sites for formation of P-N junctions when the cadmium sulfide layer is applied. Similarly, cooling the cadmium sulfide substrate under an indium layer can cause microcracking of the cadmium material, which can increase its solar absorption, thus increasing efficiency of the finished cell.

Since the invention is subject to modifications and variations, it is intended that the foregoing description and the accompanying drawings shall be interpreted as only illustrative of the invention defined by the following claims.

I claim:

1. A method of making photovoltaic cell, said method comprising steps of
    coating a metal foil substrate with cadmium telluride powder,
    moving the metal foil coated with the cadmium telluride powder across a cold plate or series of cooled rollers, while
    melting the cadmium telluride powder by passing the metal foil coated with the cadmium telluride powder under a first microwave energy source, thereby forming a thin film of cadmium telluride on the metal foil,
    coating the cadmium telluride thin film with a layer of cadmium sulfide powder,
    melting the layer of cadmium sulfide powder by passing the thin film coated with the cadmium sulfide powder under a second microwave energy source, thereby creating a P-N junction,
    coating the cadmium sulfide layer with a layer of indium and
    fusing the indium to the cadmium sulfide layer by microwave heating to produce an indium coated assembly.

2. The method of claim 1, wherein the cadmium telluride powder is provided in an amount sufficient to produce a melted cadmium telluride layer thickness of 50 to 100 nanometers.

3. The method of claim 1, further comprising steps of
    depositing a resist material on the indium coated assembly in a regular pattern of spots to prevent a subsequent layer of powder coating from forming a bond to the indium layer.

4. The method of claim 3, wherein the depositing step is carried out with a sheepsfoot roller.

5. The method of claim 3, comprising further steps of
    coating the indium layer with borosilicate powder, and
    melting the borosilicate powder by microwave heating to form a sun-facing surface of a solar cell.

* * * * *